United States Patent
Mattes et al.

(10) Patent No.: US 7,406,615 B2
(45) Date of Patent: Jul. 29, 2008

(54) CONTROL UNIT FOR GENERATING A CLOCK PULSE AS A FUNCTION OF OUTPUT SIGNALS OUTPUTTED FROM AT LEAST TWO CLOCK OUTPUTS

(75) Inventors: Bernhard Mattes, Sachsenheim (DE); Siegfried Malicki, Ingersheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/576,221

(22) PCT Filed: Jul. 22, 2004

(86) PCT No.: PCT/DE2004/001613

§ 371 (c)(1), (2), (4) Date: Feb. 2, 2007

(87) PCT Pub. No.: WO2005/045674

PCT Pub. Date: May 19, 2005

(65) Prior Publication Data

US 2007/0277054 A1    Nov. 29, 2007

(30) Foreign Application Priority Data

Oct. 13, 2003    (DE) ................. 103 47 413

(51) Int. Cl.
*G06F 1/00*    (2006.01)
*G06F 1/04*    (2006.01)
(52) U.S. Cl. .............. 713/500; 327/291; 327/292
(58) Field of Classification Search ............. 713/400, 713/500, 503
See application file for complete search history.

(56) References Cited

U.S. PATENT DOCUMENTS

| 4,282,493 A * | 8/1981 | Moreau ............ 331/2 |
| 5,864,295 A * | 1/1999 | Jarocha ............ 340/667 |
| 7,212,748 B2 * | 5/2007 | Koga ............ 398/202 |

FOREIGN PATENT DOCUMENTS

| DE | 101 23 839 | 11/2002 |
| JP | 6050886 | 2/1994 |
| JP | 7307728 | 11/1995 |
| WO | 95 21412 | 8/1995 |

* cited by examiner

*Primary Examiner*—Suresh K Suryawanshi
(74) *Attorney, Agent, or Firm*—Kenyon & Kenyon LLP

(57) ABSTRACT

A control unit featuring clocked data transmission between a processor and at least one further circuit, the processor itself outputting the clock pulse. The processor monitors the clock pulse based on the output signals of at least two clock outputs.

8 Claims, 1 Drawing Sheet

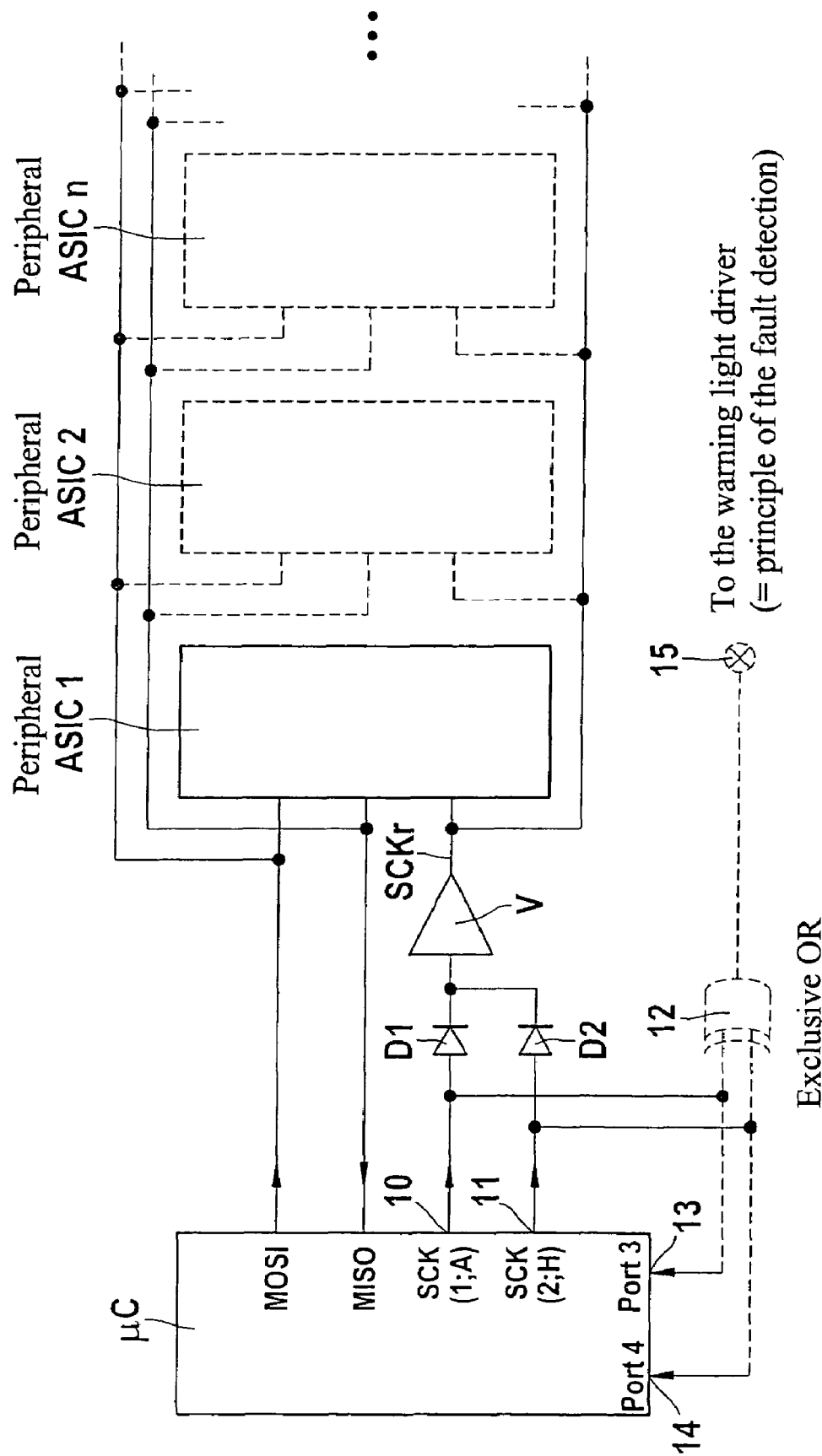

CONTROL UNIT FOR GENERATING A CLOCK PULSE AS A FUNCTION OF OUTPUT SIGNALS OUTPUTTED FROM AT LEAST TWO CLOCK OUTPUTS

FIELD OF THE INVENTION

The present invention is directed to a control unit.

BACKGROUND INFORMATION

From German Published Patent Application No. 101 23 839, it is known to provide for data transmission, here via SPI (Serial Peripheral Interface), in a control unit between a processor and at least one further circuit, in particular, ASIC's. The processor outputs the clock pulse to the ASIC's. The processor derives the clock pulse from the oscillation of a system oscillator, such as a pierce oscillator.

SUMMARY OF THE INVENTION

The inventive control unit has the advantage over the related art that the processor in the control unit, preferably a microcontroller, now monitors the clock pulse based on output signals of at least two clock outputs. This monitoring can be carried out by hardware and/or software. A monitoring signal is generated as a function of the monitoring, said monitoring signal being usable for input into a fault memory and/or for outputting a warning, for example, via a warning light. However, the fault in question can also be output on a display in the vehicle. The monitoring signal can even be used to transmit a radio transmission to a remote maintenance center, so that the fault is communicated to the remote maintenance center, which can inform the driver to have a corresponding repair carried out. It is possible to use more than two clock outputs, and thus, the corresponding output signals to monitor the clock pulse. This provides high safety against clock signal errors, which may provoke failures of the airbag control unit.

A particular advantage is that the clock outputs are connected in such a manner that the control unit generates a monitoring signal as a function of the output signals from the clock outputs. Preferably, the circuit is configured such that the outputs are connected to an exclusive-OR element so that when one clock output no longer matches the other clock output with respect to its output signal, the exclusive-OR element produces an output signal, thus indicating a fault. This is a particularly simple and reliable hardware circuit for fault indication.

It is also advantageous that the clock outputs are fed back to inputs of the processor, so that the processor itself can monitor the output signals of the clock outputs. Thus, for example, the processor is able to perform monitoring in terms of amplitude, and also to simulate the exclusive-OR function by means of software. Given an appropriate redundant system clock design, the separate monitoring of the output signals allows the control unit to continue operating, even if an output signal no longer meets the requirements.

To this end, the at least two output signals of the two clock outputs jointly generate the clock pulse for the other circuits. This is most easily achieved by ORing the two clock output signals. The ORing can preferably be accomplished by connecting a diode in the forward direction to each of the two clock outputs, respectively. Then, the diodes are connected together on the other side, so that ORing is performed. The clock signal generated in this manner can then be further processed by an impedance transformer and/or an amplifier; the impedance transformer being intended to minimize the load on the clock signals, and the amplifier being intended to suitably amplify the clock signal.

A further advantage is that the two clock outputs are assigned to different port groups, just as the two inputs which are intended for monitoring the output signals of the clock outputs. This separation into different port groups means an enlarged distance between the circuit groups on the chip, so that in the event of hardware damage of one output or input, the other output or input is not affected by this. This increases the safety of the system.

BRIEF DESCRIPTION OF THE DRAWING

The FIGURE is a block diagram of the control unit according to the present invention.

DETAILED DESCRIPTION

Control units, especially for controlling passenger protection devices, such as airbags, belt pretensioners, or roll bars, must be highly reliable so as to prevent internal failures resulting in unwanted situations for vehicle passengers. For data transmission between the microcontroller in the control unit and the connected components in the control unit, the so-called ASIC's, such as a firing circuit control system, or the sensors or interface modules, the SPI (Serial Peripheral Interface) is frequently used. In this instance, a line MOSI (Master Out Slave In) is used by the microcontroller to transmit data to the connected components, and an additional line MISO (Master In Slave Out) is used to allow the connected ASIC's to transmit data to the microcontroller. The lines in question are separate. The serial peripheral interface has still further lines, such as the chip-select line and the clock line. These are indeed separate hardware lines. The μC controller provides this clock pulse via the clock lines to the connected ASIC's, resulting in a synchronous data transmission. It is now clear that a clock signal error may result in faults in the functioning of the control unit.

Therefore, in accordance with the present invention, the clock signal is monitored based on the output signals of two clock outputs of the microcontroller, which can also be a different processor. This monitoring can be carried out by hardware or software. For hardware-based implementation, it is possible to use, for example, an exclusive-OR (non-equivalence) element, whereas in the case of software-based monitoring, the microcontroller itself is used by feeding the output signals of the clock outputs back to inputs of the microcontroller. The software-based implementation has the advantage that the individual output signals can be monitored separately. In addition, when using two clock outputs, higher redundancy for the clock generation can be achieved by preferably ORing the outputs which supply the clock signal.

The FIGURE is a block diagram of the control unit according to the present invention. The block diagram concentrates only on the essential elements of the present invention, so that other components which are also present in the device are not shown for the sake of simplicity. A microcontroller μC is connected via a data output MOSI to ASIC's 1, 2 and n present in the control unit. Line MOSI is used for data transmission from μC to ASIC's 1, 2 and n. Microcontroller μC is also connected to ASIC's 1, 2 and n via a data input. Here, however, lines MISO is used for data transmission of the ASIC's to the microcontroller. The data transmission between the microcontroller and ASIC's 1, 2 and n can take place virtually in parallel. Via further outputs 10 and 11, clock signals of microcontroller μC are output, said clock signals being generated by microcontroller μC by dividing an oscillator signal. Oscillators that can be used here include, for example, a pierce oscillator which can easily be set into oscillation and delivers a stable clock signal. Clock outputs 10 and 11 are connected to diodes D1 and D2, respectively; the diodes, in turn, being interconnected to an input of an amplifier V. Amplifier V then delivers the clock pulse SCKr. This clock pulse then goes to components ASIC 1, ASIC 2 and ASIC n. Thus, microcontroller μC and ASIC's 1, 2 through n operate in parallel with respect to processing.

However, the output signals of clock outputs 10 and 11 are each also supplied to inputs of an exclusive-OR element. The exclusive-OR element produces a signal at its output when the two input signals are different. This means that the exclusive-OR element produces a 1 only if a 0 and a 1, or a 1 and a 0 are present, otherwise it produces a 0. A warning light driver 15 is controlled as a function of this output signal of exclusive-OR element 12. In the event of a fault, i.e., when the two clock signals are different, said warning light driver activates a warning light to indicate the fault.

Alternatively or additionally, the output signals of clock outputs 10 and 11 can also be monitored by microcontroller μC itself. To this end, the output signals are fed back to two inputs 13 and 14, respectively. Microcontroller μC can then monitor the output signals by means of software. The microcontroller can do this, for example, by simulating the exclusive-OR function by means of software, and by separately monitoring the output signals in terms of amplitude. Microcontroller μC then generates a monitoring signal as a function thereof, said monitoring signal being used, for example, for controlling the warning light driver. However, it is also possible to display a warning on a display in the vehicle. Inputs 3 and 4 should be assigned to different port groups. Port groups are understood here to be adjacent inputs and outputs. Clock outputs 10 and 11 should also belong to different port groups in order not to be geographically adjacent so as to prevent failure of the two clock outputs in the event of a hardware fault.

Instead of the SPI communication, which is a bus communication, it is also possible to use point-to-point connections between microcontroller μC and the individual ASIC's, respectively. However, other bus communications are also possible alternatively to the SPI connection.

What is claimed is:

1. A control unit comprising:
a processor outputting a clock pulse;
at least one further circuit, wherein:
   a clocked data transmission occurs between the processor and the at least one further circuit;
   the processor monitors the clock pulse based on output signals of at least two clock outputs; and
   the at least two clock outputs are connected in such a manner that the clock pulse is generated as a function of the output signals; and
an OR element to which the at least two clock outputs are supplied to generate the clock pulse.

2. The control unit as recited in claim 1, wherein:
the OR element comprises:
   a first diode; and
   a second diode; and
the first diode and the second diode cooperate to perform an OR operation on the at least two clock outputs.

3. The control unit as recited in claim 1, wherein the clock pulse is supplied to at least one of an impedance transformer and an amplifier.

4. The control unit as recited in claim 1, wherein the at least two clock outputs are assigned to different port groups.

5. The control unit as recited in claim 1, wherein the at least two clock outputs are connected in such a manner that the control unit generates a monitoring signal as a function of the output signals.

6. The control unit as recited in claim 5, further comprising:
an exclusive-OR element to which the output signals are supplied, respectively, wherein the monitoring signal is generated as a function of a signal of the exclusive-OR element.

7. The control unit as recited in claim 1, wherein:
the at least two clock outputs are connected in such a manner that the output signals are fed back respectively to a first input and a second input of the processor in order for the processor to monitor the output signals and to generate a monitoring signal as a function thereof.

8. The control unit as recited in claim 7, wherein the first input and the second input are assigned to different port groups.

* * * * *